United States Patent
Higashi et al.

(10) Patent No.: US 7,514,967 B2
(45) Date of Patent: Apr. 7, 2009

(54) DRIVER FOR VOLTAGE DRIVEN TYPE SWITCHING ELEMENT

(75) Inventors: Kazuyuki Higashi, Yokohama (JP); Yoshinori Sato, Yokohama (JP)

(73) Assignee: Nissan Motor Co., Ltd., Yokohama, Kanagawa (JP)

( * ) Notice: Subject to any disclaimer, the term of this patent is extended or adjusted under 35 U.S.C. 154(b) by 251 days.

(21) Appl. No.: 11/601,313

(22) Filed: Nov. 17, 2006

(65) Prior Publication Data

US 2007/0115038 A1    May 24, 2007

(30) Foreign Application Priority Data

Nov. 18, 2005  (JP) ............... 2005-333638

(51) Int. Cl.
*H03B 1/00* (2006.01)

(52) U.S. Cl. ....................... 327/108; 327/434

(58) Field of Classification Search ......... 327/108–112, 327/434
See application file for complete search history.

(56) References Cited

U.S. PATENT DOCUMENTS

| | | | | |
|---|---|---|---|---|
| 5,910,749 A | * | 6/1999 | Kimura | 327/541 |
| 5,977,814 A | * | 11/1999 | Ishii | 327/434 |
| 6,054,890 A | * | 4/2000 | Giacomo | 327/375 |
| 6,127,746 A | * | 10/2000 | Clemente | 307/131 |
| 6,348,819 B1 | * | 2/2002 | Ten Pierick et al. | 327/110 |
| 6,570,413 B1 | * | 5/2003 | Kumagai et al. | 327/108 |
| 7,151,401 B2 | * | 12/2006 | Inoue | 327/434 |

FOREIGN PATENT DOCUMENTS

| JP | 2004-187463 | 7/2004 |
|---|---|---|
| US | 2005/0206438 A1 | 9/2005 |

* cited by examiner

*Primary Examiner*—Lincoln Donovan
*Assistant Examiner*—Hai L. Nguyen
(74) *Attorney, Agent, or Firm*—Young Basile (57) ABSTRACT

A driver apparatus and method for driving a voltage driven type switching element that discharge an electrical charge stored at the gate terminal of the voltage driven type switching element at a discharge rate. The discharge rate is controlled so that the change rate over time of the voltage between the collector and emitter terminals of the voltage driven type switching element is limited to a second change rate during the turn-off operation. The starting time of the control of the change rate over time to attain the second change rate is delayed for a predetermined delay time after start of the turn-off operation and before a time when the voltage between the collector and emitter terminals first reaches the power source voltage level. During the delay time, the discharge rate is initially at a first change rate higher than the second change rate.

21 Claims, 4 Drawing Sheets

DRIVER FOR VOLTAGE DRIVEN TYPE SWITCHING ELEMENT

CROSS-REFERENCE TO RELATED APPLICATION

This application claims priority from Japanese Patent Application Serial No. 2005-333638, filed Nov. 18, 2005, which is incorporated herein in its entirety by reference.

TECHNICAL FIELD

The present invention pertains to driving a voltage driven type switching element.

BACKGROUND

There are known drivers for voltage driven type switching elements. For example, in Japanese Kokai Patent Application No. 2004-187463, the discharge rate of the gate electrical charge of a voltage driven type switching element is controlled during turn-off so that the change rate over time of the collector voltage of the voltage driven type switching element becomes a prescribed constant value, and generation of excessive surge voltage is prevented.

BRIEF SUMMARY OF THE INVENTION

In one apparatus for driving a voltage driven type switching element including a collector terminal, an emitter terminal and a gate terminal connected to a power source supplied at a voltage level and taught herein, the apparatus comprises a discharge circuit connected to the voltage driven type switching element and operable to discharge an electrical charge stored at the gate terminal at a discharge rate during a turn off operation of the voltage driven type switching element in which the voltage driven type switching element makes a transition from on to off, a discharge rate controller circuit operable to control the discharge rate so that a change rate over time of a voltage between the collector terminal and the emitter terminal is limited to a second change rate during the turn off operation and a delay circuit operable to delay a starting time of the operation of the discharge rate controller circuit to limit the discharge rate to the second change rate for a prescribed delay time after a start of the turn off operation and before a time when the voltage between the collector terminal and the emitter terminal first reaches the voltage level of the power source, thereby providing a time period during which the discharge rate is initially at a first change rate higher than the second change rate.

Another apparatus taught herein comprises, for example, means for initiating a transition of the voltage driven type switching element from an on-state to an off-state in response to a triggering of a switch turn-off signal, means for controlling a discharge rate of an electrical energy stored at the gate terminal during the transition so that a change rate over time of a voltage between the collector terminal and the emitter terminal is limited to a second during the turn-off operation and means for delaying a starting time of the controlling the discharge rate for a prescribed delay time after initiating the transition and before a time when the voltage between the collector terminal and the emitter terminal first reaches the voltage level of the power source, thereby providing a time period during which the discharge rate is initially at a first change rate higher than the second change rate.

Methods for driving a voltage driven type switching element are also taught herein. One such method includes initiating a transition of the voltage driven type switching element from an on-state to an off-state, discharging an electrical charge stored at the gate terminal at a discharge rate during the transition, controlling the discharge rate so that a change rate over time of a voltage between the collector terminal and the emitter terminal is limited to a second change rate during the transition and delaying the starting time of the controlling the discharge rate to the second change rate for a prescribed delay time after initiating the transition and before reaching a time when the voltage between the collector terminal and the emitter terminal first reaches the voltage level of the power source, thereby providing a time period during which the discharge rate is initially at a first change rate higher than the second change rate.

BRIEF DESCRIPTION OF THE DRAWINGS

The description herein makes reference to the accompanying drawings wherein like reference numerals refer to like parts throughout the several views, and wherein.

DETAILED DESCRIPTION OF EMBODIMENTS OF THE INVENTION

Usually when a voltage driven type switching element, such as an IGBT or a power MOSFET is turned off, a surge voltage is generated, and a voltage equal in magnitude to the sum of the surge voltage and the power voltage, that is, the voltage of the power source connected to the collector terminal of the voltage driven type switching element, is applied between the collector terminal and the emitter terminal of the voltage driven type switching element. This presents a problem as voltage driven type switching elements are susceptible to heat damage if exposed to a voltage that exceeds the voltage rating of the voltage driven type switching element. Consequently, the voltage between the collector-emitter terminals of the voltage driven type switching element (referred to herein as collector voltage) must be controlled not to exceed the voltage rating of the voltage driven type switching element.

The surge voltage at turn-off generally increases as the switching speed increases (that is, when the change rate over time of the collector voltage increases). In consideration of this characteristic feature, Japanese Kokai Patent Application No. 2004-187463 mentioned above describes a driver for a voltage driven type switching element having a circuit in which a pnp transistor is connected to the gate terminal of the voltage driven type switching element by way of a gate resistor for discharging the gate charge of the voltage driven type switching element. That reference also describes a circuit in which the collector terminal of the voltage driven type switching element and the base terminal of the pnp transistor are connected via a capacitor and diode. A pull-down resistor is connected between the reference potential (ground or the like) and the connecting point between the capacitor and the diode. By way of this circuit, the gate current, and thus the discharge rate of the gate charge, is controlled such that generation of excessive surge voltage is avoided, and the collector voltage is prevented from exceeding the voltage rating during turn-off. However, certain problems are presented this circuit.

First, the driver controls the switching rate of the voltage driven type switching element at a rate appropriate for the highest power voltage expected to be handled by the switching element. This is necessary to ensure that the voltage rating of the voltage driven type switching element is not exceeded by the sum voltage of the power voltage and the surge voltage when the power voltage is high, but results in an unnecessarily low switching rate when the power voltage is low. Second, because the switching rate is always controlled at a constant rate, regardless of the power voltage, unnecessary switching loss occurs.

These problems are due to the fact that, according to the driver described in Japanese Kokai Patent Application No. 2004-187463, the change rate over time of the collector voltage is not responsive to the power voltage. This fails to recognize that the tolerable surge voltage of a voltage driven type switching element usually varies as a function of the power voltage applied to the voltage driven type switching element. Instead, the voltage driven type switching element is protected from the surge voltage generated at the time of turn-off for any power voltage, not by responding to the actual power voltage, but by fixing a low change rate for the collector voltage based upon an assumed maximum power voltage.

Thus, by assuming a maximum expected power voltage and limiting the change rate over time of collector voltage accordingly to prevent the voltage rating of the voltage driven type switching element from being exceeded, there is a margin between the collector voltage and the voltage rating. However, in light of the inability to increase the change rate over time of collector voltage, that is, the switching rate in turn-off, this margin remains unutilized, and one cannot reduce the switching loss even when the power voltage is low.

In contrast, the driver for a voltage driven type switching element described herein prevents the collector voltage of the voltage driven type switching element from exceeding the voltage rating, while simultaneously lowering the switching loss.

Figure 1:
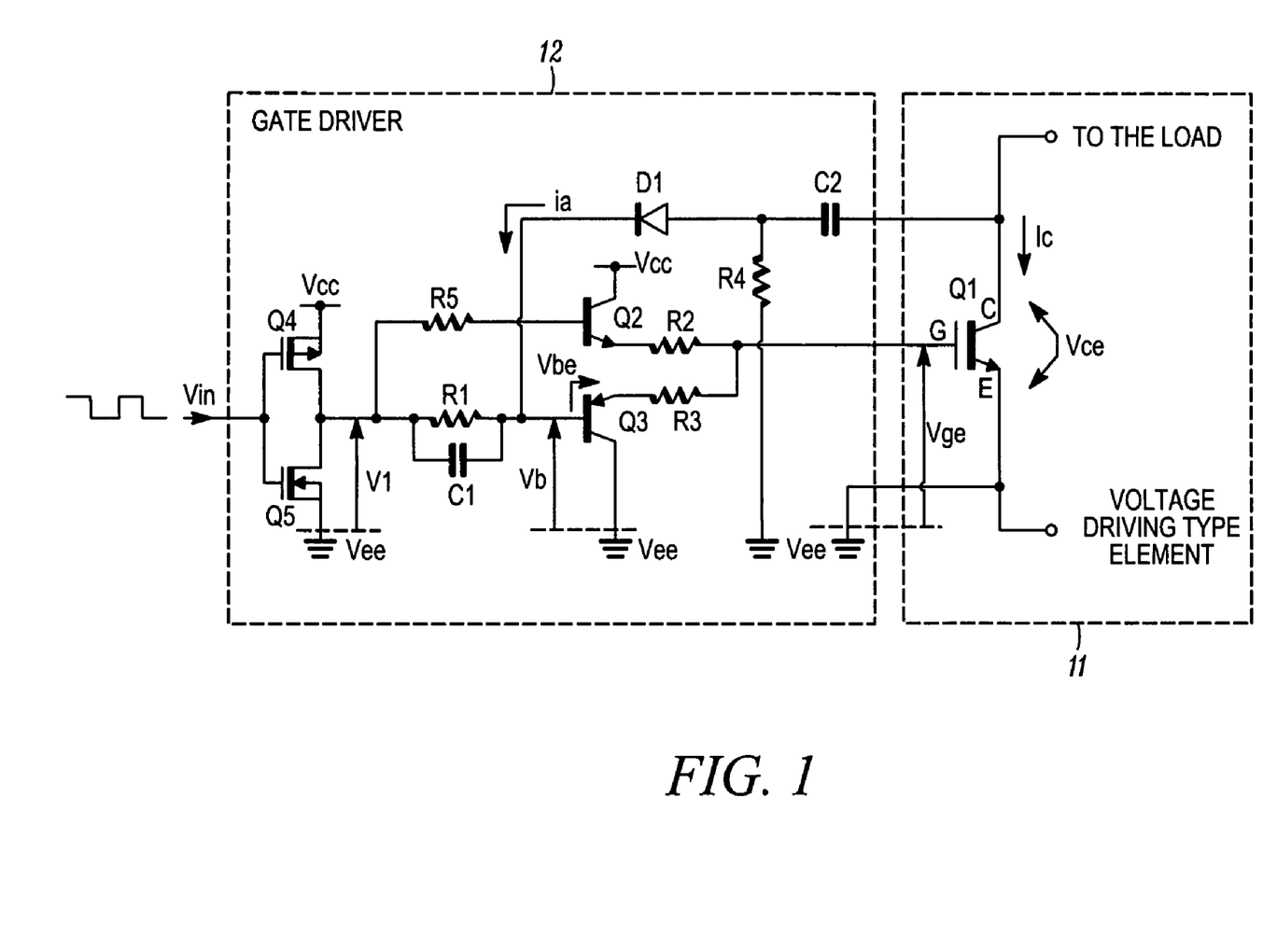
FIG. 1 is a circuit diagram illustrating a driver for a voltage driven type switching element, wherein an IGBT is shown as an exemplary voltage driven type switching element.

FIG. 1 is a circuit diagram of an exemplary driver for a voltage driven type switching element having a voltage driven type switching element 11 for driving a load, and a gate driver 12 for the voltage driven type switching element 11. In connection with the exemplary circuit of FIG. 1, an insulated gate bipolar transistor, or IGBT, Q1 is shown as the voltage driven type switching element 11. However, it should be understood that the gate driver 12 is not limited in application to driving an IGBT, and other voltage driven type switching elements 11 may be used with the gate driver 12.

The gate terminal G of IGBT Q1 is connected to a power voltage Vcc by a charging npn transistor Q2 in series with a gate resistor R2, which control charging of the gate charge at the gate terminal G of IGBT Q1. The gate terminal G of IGBT Q1 is further connected to a reference potential Vee by a discharging pnp transistor Q3 in series with a gate resistor R3, which control discharging of the gate charge of the gate terminal G of IGBT Q1. Here, reference potential Vee is equal to the potential at the emitter terminal E of IGBT Q1, and it is the reference potential for gate driver 12.

The base terminal of the charging npn transistor Q2 is connected via a base resistor R5 to the drain terminals of a p-channel MOSFET Q4 and an n-channel MOSFET Q5, which are connected in push-pull configuration. The base terminal of discharging pnp transistor Q3 is connected via base resistor R1 to the drain terminals of the p-channel MOSFET Q4 and the n-channel MOSFET Q5. The source terminal of the p-channel MOSFET Q4 is connected to the power voltage Vcc, and the source terminal of the n-channel MOSFET Q5 is connected to the reference potential Vee.

The gate terminals of the p-channel MOSFET Q4 and the n-channel MOSFET Q5 are connected to an input signal Vin. Input signal Vin is a high-voltage signal or a low voltage signal such that it is possible that the charging npn transistor Q2 and the discharging pnp transistor Q3 are turned on and off by applying the input signal Vin.

In addition to being connected to the load, the collector terminal C of IGBT Q1 is connected to the base terminal of the pnp transistor Q3 by a capacitor C2 and diode D1, which are connected in series. Additionally, a pull-down resistor R4 may be connected between the reference potential Vee and the connection point between the capacitor C2 and the diode D1, as will be explained in greater detail herein. Thus, during turn-off of the IGBT Q1, feedback regarding the change over time of the voltage between the collector terminal C and the emitter terminal, hereinafter referred to as the collector voltage Vce, is provided to the base terminal of the pnp transistor Q3.

That is, together with pnp transistor Q3 for discharge of the charge stored at the gate of IGBT Q1, base resistor R1, IGBT Q1 for controlling the discharge rate, and gate resistor R3, capacitor C2, diode D1, and pull-down resistor R4 form means for controlling the rate of change of the charge stored at the gate terminal G of IGBT Q1.

From the foregoing, it can be appreciated that a discharge circuit is formed by the discharging pnp Q3 and the gate resistor R3 for discharging the gate charge stored at the gate terminal G of the IGBT Q1 during turn-off of the IGBT Q1. Furthermore, the discharge circuit is operative to discharge the gate charge at the gate terminal G of the IGBT Q1 at a discharge rate controlled by the operation state of the discharging pnp transistor Q3. It can further be appreciated from the foregoing that, in order to control the operation state of the discharging pnp transistor Q3, a discharge rate controller circuit is formed by the base resistor R1, the diode D1, the capacitor C2, and the pull-down resistor R4. The discharge rate controller circuit controls operation of the discharging pnp transistor Q3 to control the rate of discharge of the electrical charge stored at the gate terminal G of the IGBT Q1. Also, the discharge rate of the charge stored at the gate terminal G of the IGBT Q1 is a function of both the capacitance value of capacitor C2 and the resistance value of gate resistor R3 so that the change rate over time dV/dt of the collector voltage Vce of the IGBT Q1 is limited to a prescribed change rate during turn-off of the IGBT Q1.

The pull-down resistor R4 is connected between the reference potential Vee of the gate driver 12 and the connecting point between the capacitor C2 and the diode D1. Also, the diode D1 has its anode connected to the side of capacitor C2 and its cathode connected to the side of the base terminal of pnp transistor Q3 so that current flow from the base terminal of the discharging pnp transistor Q3 to the capacitor C2 is restricted, and discharging pnp transistor Q3 is protected from application of reverse voltage to the base terminal of the discharging pnp transistor Q3. Consequently, diode D1 and pull-down resistor R4 may be omitted when, for instance, the voltage rating of the discharging pnp transistor Q3 is sufficiently high.

In order to delay a starting time of the operation of the discharge rate controller circuit to limit the discharge rate to the prescribed change rate for a prescribed delay time after the start of turn-off of the voltage driven type switching element (IGBT Q1), a delay circuit is connected to the discharge rate controller circuit. Namely, a capacitor C1 is connected in parallel to base resistor R1 of the discharge rate controller circuit to provide delay means that delays the starting time of the operation of the discharge rate controller circuit to limit the discharge rate to the prescribed change rate for a prescribed delay time so that the change rate over time dV/dt of the collector voltage Vce of the IGBT Q1 is not changed to the prescribed change rate until after expiration of the prescribed delay time. The capacitor C1 has a capacitance value larger than the capacitance value of the capacitor C2, and the prescribed delay time is a function of the capacitance value of the capacitor C2. The prescribed delay time begins at the start of turn-off of the voltage driven type switching element and ends when the collector voltage reaches a prescribed voltage, which corresponds to the time at which the charge at the base terminal of the discharging pnp transistor Q3 reaches the threshold value for operation of the discharging pnp transistor Q3.

In other words, by means of capacitor C1 connected in parallel with base resistor R1 to form the delay circuit, the discharge rate of the gate charge of the IGBT Q1 is controlled during the delay time. Thus, after start of the turn-off operation, a high change rate of the collector voltage Vce over time dV/dt with a steep gradient (high switching rate) is established immediately after starting turn-off of the IGBT Q1. However, once the collector voltage Vce of the IGBT Q1 reaches the prescribed voltage after the prescribed delay time determined by the capacitance value of the capacitor C1, a prescribed change rate with a mild gradient (low switching rate) is established.

In FIG. 1, the gate voltage Vge of the IGBT Q1, the base voltage Vb of the discharging pnp transistor Q3 and the drain voltage V1 of the p-channel MOSFET Q4 and the n-channel MOSFET Q5 are all potentials with reference to reference potential Vee.

Figure 3:
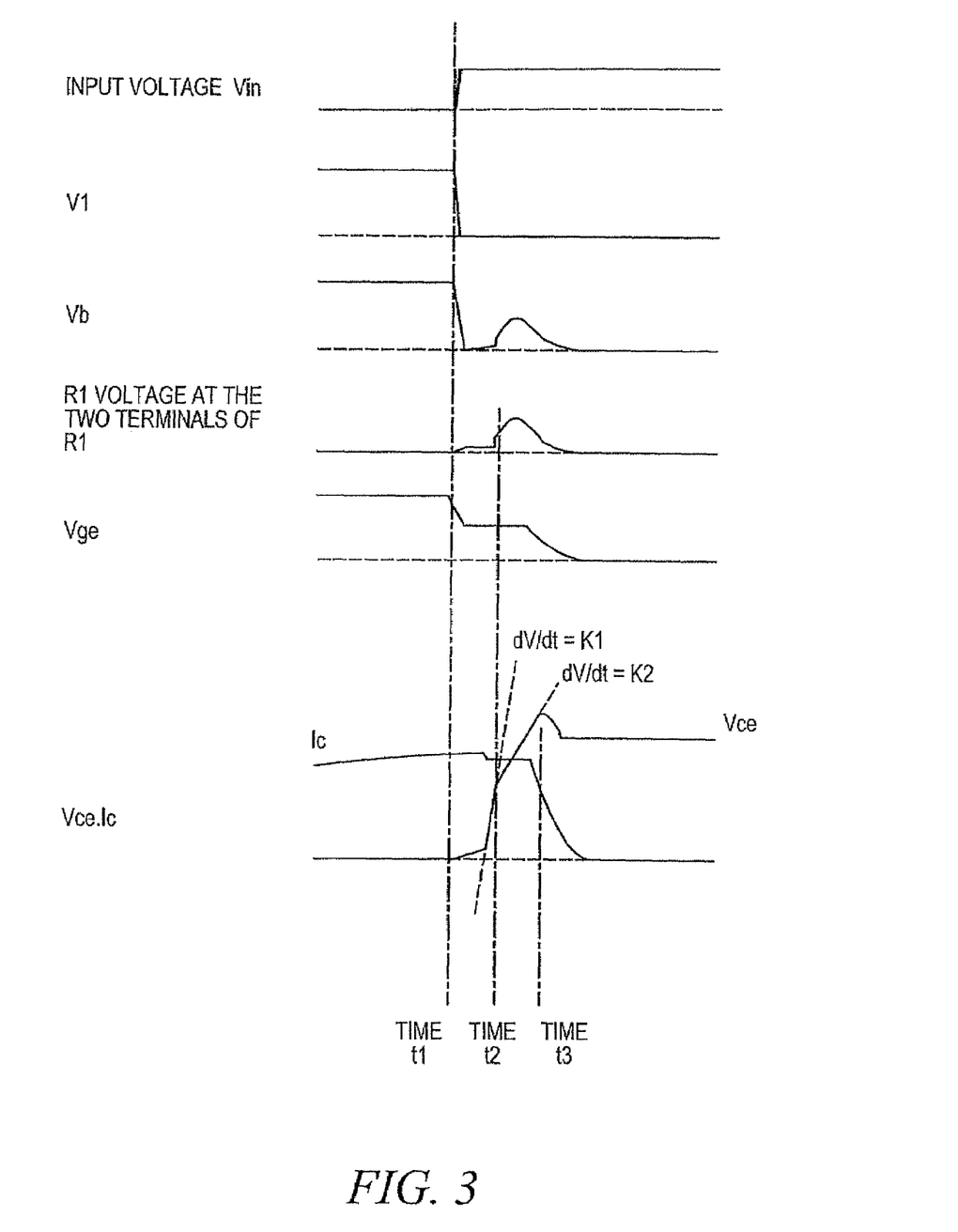
FIG. 3 illustrates switching waveforms at selected points in the circuit shown in FIG. 1 when the input signal is changed, and the IGBT is turned off.

Turning to FIG. 3, an explanation will be given regarding the operation of gate driver 12 with respect to the IGBT Q1 as an example of a voltage driven type switching element 11. FIG. 3 illustrates the switching waveforms of the various portions in the circuit shown in FIG. 1 when input signal Vin is changed, and the IGBT Q1 connected to a motor or other inductive load is turned off.

As shown therein, at time t1, the input signal Vin is changed from low to high (i.e., from the low voltage signal to the high voltage signal), thereby turning off the p-channel MOSFET Q4 and turning on the n-channel MOSFET Q5.

When the n-channel MOSFET Q5 is turned on, the drain voltage V1 of the p-channel MOSFET Q4 and the n-channel MOSFET Q5 in push-pull configuration changes from high to low. Consequently, the charging npn transistor Q2 transitions from on to off, and, at the same time, the base potential Vb of the pnp transistor Q3 for discharging the gate charge is changed from high to low, thereby changing the state of the discharging pnp transistor Q3 from off to on. Thus, the gate input signal (gate current) applied to the gate terminal of the IGBT Q1 changes, and discharging the gate charge of the IGBT Q1 starts.

The discharge rate of the gate charge of the IGBT Q1 depends on the operation state of the gate resistor R3 of the IGBT Q1 and the operation state of the pnp transistor Q3. Consequently, the capacitor C1 may serve to control the magnitude of the current at the base terminal of the discharging pnp transistor Q3, and the base potential Vb of the discharging pnp transistor Q3.

At time t1 the change of the input signal Vin from low to high signals the start of the turn-off operation of the IGBT Q1, and the gate charge of the IGBT Q1 begins to discharge. As shown in FIG. 3, as the gate voltage Vge of the IGBT Q1 falls, the collector Vce of the IGBT Q1 rises according to a positive change rate over time dV/dt of collector voltage Vce.

During the initial rise of the collector voltage Vce, current ia (shown in FIG. 1) flows from collector terminal C of the IGBT Q1 into the capacitor C2. Current ia flows through diode D1 to the base resistor R1 of the pnp transistor Q3 and to the capacitor C1. Consequently, as shown in FIG. 3, the base potential Vb of pnp transistor Q3 begins to rise.

As the base potential Vb rises, the base current of the pnp transistor Q3 is suppressed, and the gate discharge quantity of the IGBT Q1 is thereby restricted. As a result, during the period from discharge start time t1 of the gate charge to time t3 when the threshold (Vth) of IGBT Q1, that is, the peak value of the collector voltage Vce, is crossed, the change rate over time dV/dt of the collector voltage Vce is controlled by the magnitude of the current ia.

Figure 2:
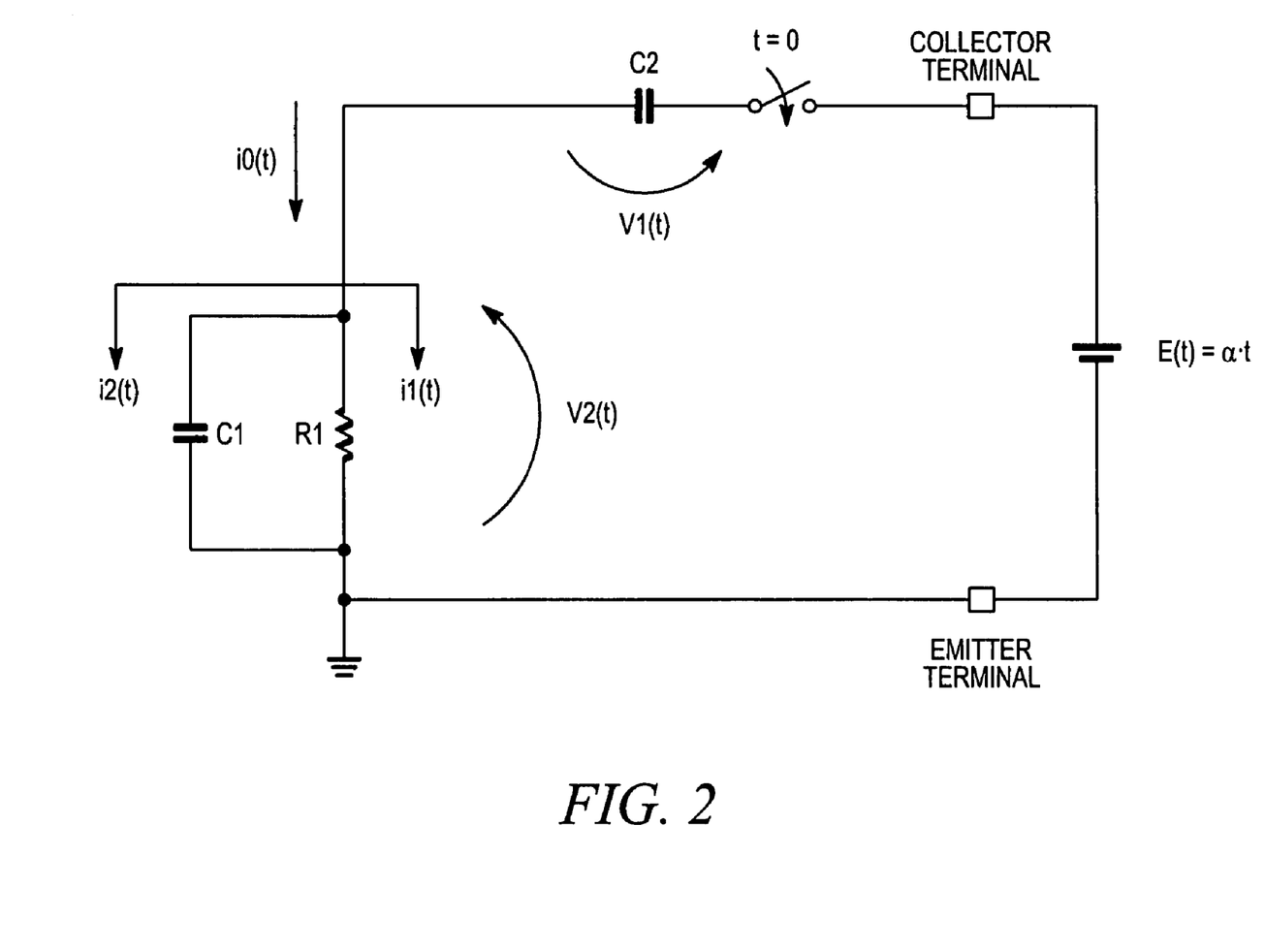
FIG. 2 is an equivalent circuit diagram illustrating the operating principle of the circuit shown in FIG. 1.

Referring now to FIG. 2, control of the change rate over time dV/dt of collector voltage Vce will now be explained during the period from time t1, the start of the turn-off operation of the IGBT Q1, to time t3, when the peak value of the collector voltage Vce of the IGBT Q1 is reached.

Here, current flowing from collector terminal C of IGBT Q1 in the period from time t1 to time t3 is equivalent to current i0(t). In this operation, change rate over time dV/dt of collector voltage Vce is changed in two steps as shown in FIG. 3, with a first change rate over time K1 and a second, lower change rate over time K2. As will be better understood from the following discussion, the first change rate over time K1 occurs during the delay time provided by operation of the delay circuit, namely the capacitor C1 connected in parallel with the base resistor R1. After the delay time, the change rate over time dV/dt of collector voltage Vce becomes limited to the second, prescribed lower change rate K2 provided by operation of the change rate control means of the discharge rate controller circuit, namely capacitor C2 and the base resistor R1, and the discharge circuit, namely the gate resistor R3 and the discharging pnp transistor Q3.

Returning now to FIG. 2, the current flowing through base resistor R1 is i1(t), the current flowing to capacitor C1 is i2(t), and the input voltage is E(t). The input voltage E(t) is the collector-emitter voltage (that is, collector voltage) Vce of the IGBT Q1, and its change rate over time dV/dt is a constant value α, so that the change rate can be represented as a linear function of time t according to $E(t) = \alpha \cdot t$. Assuming that the voltage between the two terminals of the capacitor C2 has time function V1(t), and the voltage between the two terminals of the base resistor R1 has time function V2(t), one obtains the following equivalent formula:

$$V1(t) + V2(t) = E(t) = \alpha \cdot t \qquad \text{Formula (1)}$$

Assuming the quantity of the charge stored in the capacitor C2 is Q1(t), Formula (1) can be reformed as follows:

$$Q1(t)/C2 + R1 \cdot i1(t) = \alpha \cdot t \qquad \text{Formula (2)}$$

Then, by differentiating the two sides of Formula (2), one obtains Formula (3) below:

$$(1/C2) \cdot d/dt(Q1(t)) + R1 \cdot d/dt(i1(t)) = \alpha \qquad \text{Formula (3)}$$

Here, using Formulas (3), (4), (5) and (6), one can determine current i1(t) at any time t (that is, the time of start of discharge of the gate charge of IGBT Q1 t1 until the time t3 when the peak value of collector voltage Vce of IGBT Q1 is reached). More specifically, one obtains Formula (7) below.

$$i0(t)=i1(t)+i2(t) \quad \text{Formula (4)}$$

$$i0(t)=d/dt(Q1(t)) \quad \text{Formula (5)}$$

$$i2(t)=C1\cdot d/dt(V2(t)) \quad \text{Formula (6)}$$

$$\{R1+(R1\cdot C1)/C2\}\cdot d/dt(1(t))+(1/C2)\cdot i1(t)=\alpha \quad \text{Formula (7)}$$

If one solves the differential equation of Formula (7), one obtains Formula (8) below.

$$i1(t)=C2\cdot\alpha\cdot[1-\exp\{(-t)/(R1\cdot(C1+C2))\}] \quad \text{Formula (8)}$$

As a result, voltage V2(t) between the two terminals of resistor R1 is given by Formula (9) below:

$$V2(t)=R1\cdot i1(t)=R1\cdot C2\cdot\alpha[1-\exp\{(-t)/(R1\cdot(C1+C2))\}] \quad \text{Formula (9)}$$

When Formula (9) is applied to the circuit shown in FIG. 1, one can see that in time t (t1≦t≦t3), the voltage V2(t) between the two terminals of the resistor R1 that is finally reached, that is, base potential Vb of the pnp transistor Q3, is determined by the value of the capacitor C2, the resistance of the resistor R1, and the change rate over time α (−dV/dt) of the collector voltage Vce of the IGBT Q1.

The capacitor C1 connected in parallel to the resistor R1 is irrelevant to the determination of the final value of the base potential Vb of the pnp transistor Q3. This is because, as can be seen from Formula (9), the capacitor C1 is related only to the time constant {R1·(C1+C2)}, and thus is relevant to determination of when the voltage V2(t) between the two terminals of resistor R1, that is, the final base potential Vb of pnp transistor Q3, is reached. The capacitor C1 is thus not relevant to the magnitude of the final base potential Vb.

Here, by connecting the capacitor C1 having a capacitance value larger than that of the capacitor C2 in parallel to resistor R1 so that the relationship of {capacitance value of capacitor C1}>>{capacitance value of capacitor C2}, current ia almost entirely flows to capacitor C1 from time t1, when turn-off of the IGBT Q1 begins, to time t2, when capacitor C1 is fully charged.

After time t2 is reached, and the capacitor C1 is fully charged, the resistor R1 becomes the dominant factor. As shown at time t2 in FIG. 3, the voltage between the two terminals of the resistor R1, that is, base potential Vb of the discharging pnp transistor Q3, starts rising significantly.

The gate discharge current ig from the IGBT Q1, which determines the discharge rate of the gate charge of the IGBT Q1, can be represented as follows:

$$ig=(Vge-Vb-Vbe)/R3 \quad \text{Formula (10)}$$

As explained above, Vge is the gate voltage of the IGBT Q1, Vb is the base voltage of the discharging pnp transistor Q3, and Vbe is the base-emitter voltage of the discharging pnp transistor Q3. When the base potential Vb of the discharging pnp transistor Q3 rises and reaches a prescribed voltage level near the threshold voltage for the pnp transistor Q3 (i.e., the voltage at which the transistor switches from on to off), the gate discharge current ig from the IGBT Q1 drastically decreases, and the discharge rate of the gate charge of the IGBT Q1 moderates and changes to a lower rate.

According to Formulas (9) and (10), during the period when discharge to the capacitor C1 is the dominant factor, that is, in the period from right after start of the turn-off operation of the IGBT Q1 at time t1, to time t2 when the capacitor C1 has finished charging, and the base potential Vb of the discharging pnp transistor Q3 reaches the prescribed voltage level near the threshold voltage of the operation of the discharging pnp transistor Q3, the feedback control for adjustment of gate discharge current ig via the capacitor C2 is almost inoperative. The change rate over time α of the collector voltage Vce becomes the high positive change rate K1, as shown in FIG. 3. On the other hand, during the period when inflow of the current ia to the resistor R1 becomes the dominant factor, that is, after time t2 when the base voltage Vb of the discharging pnp transistor Q3 reaches the prescribed voltage level near the prescribed operation threshold voltage, the feedback control for adjusting gate discharge current ig via the capacitor C2 starts its function of change rate control, and change rate over time α of collector voltage Vce rapidly changes to low positive K2, as also shown in FIG. 3.

Thus, by connecting the capacitor C1 in parallel with the resistor R1 of the discharging pnp transistor Q3, throughout the period from time t1 to time t3 the change rate over time α of the collector voltage Vce takes different values before and after time t2 when the base voltage Vb of the pnp transistor Q3 becomes the prescribed voltage level near the prescribed operation threshold voltage instead of remaining at a constant value.

In this way, the capacitor C1, which is connected in parallel with the resistor R1 of the discharging pnp transistor Q3, functions as a delay circuit for delaying the starting time of the function of the discharge rate controller circuit to limit the discharge rate to K2 from the beginning of the turn-off operation at time t1 until the base voltage Vb of pnp transistor Q3 reaches a prescribed voltage level near the prescribed operation threshold voltage at time t2.

As explained above, during the period from time t1 to time t3, change rate over time α of collector voltage Vce is not always at a constant value. Instead, depending on whether the discharge rate control circuit for performing feedback control to adjust gate discharge current ig is operative or not, change rate over time α of collector voltage Vce has different values before and after time t2 when base voltage Vb of pnp transistor Q3 reaches the prescribed voltage level near the prescribed operation threshold voltage. Consequently, before and after time t2, when base voltage Vb of pnp transistor Q3 approaches the prescribed operation threshold, change rate over time α of collector voltage Vce of Formula (9) can be approximately represented by different fixed values K1 and K2, and base voltage Vb of pnp transistor Q3 at time t (t1≦t≦t3) can be approximately represented by Formulas (11) and (12) below.

More specifically, when t1≦t≦t2, one has $$Vb(t)=R1\cdot i1(t)=R1\cdot C2\cdot K1\cdot[1-\exp\{(-t)/(R1\cdot(C1+C2))\}] \quad \text{Formula (11)}$$

and when t2≦t≦t3, one has $$Vb(t)=R1\cdot i1(t)=R1\cdot C2\cdot K2\cdot[1-\exp\{(-t)/(R1\cdot(C1+C2))\}] \quad \text{Formula (12)}$$

As can be seen from Formulas (10), (11) and (12), as time elapses after start time t1 for discharging the gate charge, gate discharge current ig changes in two steps depending on whether the discharge rate controller circuit is operative. That is, when the collector voltage Vce is lower, the discharge rate of the gate charge of the IGBT Q1 increases, and the gradient of change rate over time dV/dt of the collector voltage Vce becomes steeper. On the other hand, when the collector voltage Vce increases, the discharge rate of the gate charge of the IGBT Q1 changes to a lower level, so that change rate over time dV/dt of the collector voltage Vce attains a mild gradient. In this way, two-step change is performed.

Consequently, by selecting the capacitance of capacitor C1 such that the sum of the surge voltage and the collector voltage Vce at the time when the change rate over time of the collector voltage changes from K1 to K2 does not exceed the voltage rating, it is possible to prevent voltage rate from being exceeded, while simultaneously allowing a higher change rate over time of the collector voltage while the collector voltage Vce is lower.

Also, the delay circuit is operative to delay the time of start at which operation of the discharge rate controller circuit begins as a function of the capacitance value of the capacitor C1. Thus, the delay time begins at time t1, when the turn-off operation of the IGBT Q1 begins, and the delay time ends at time t2, when the base voltage Vb of the discharging pnp transistor Q3 reaches its threshold voltage. It may also be explained as follows: because change rate K1 of the collector voltage during the period from t1 to t2 is a constant change rate determined by resistor R3, the delay operation is performed during the period from time t1, when discharge of the gate charge of the IGBT Q1 begins, to the time when the collector voltage Vce of IGBT Q1 reaches a prescribed voltage level.

Figure 4A:
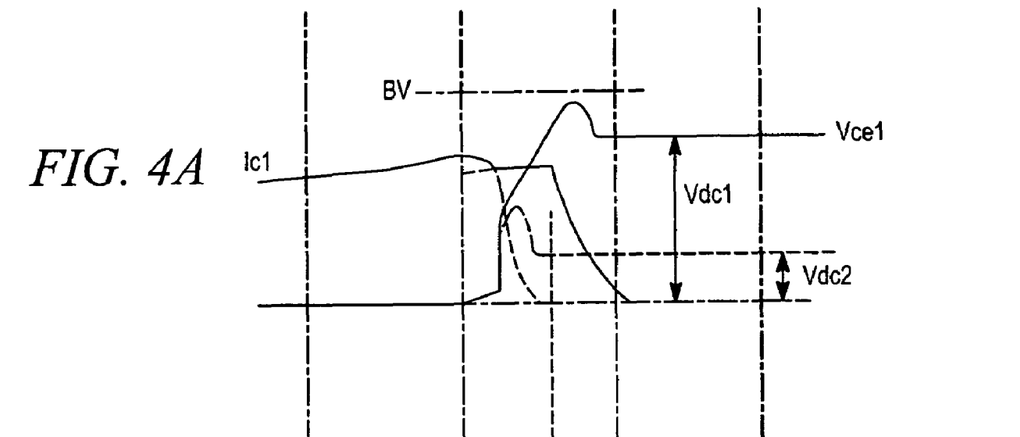
FIGS. 4A and 4B are graphs comparing the switching waveforms when the IGBT is turned off in the circuit shown in FIG. 1 as an application example of the present invention with a previously known driver for a voltage driven switching element.
Figure 4B:
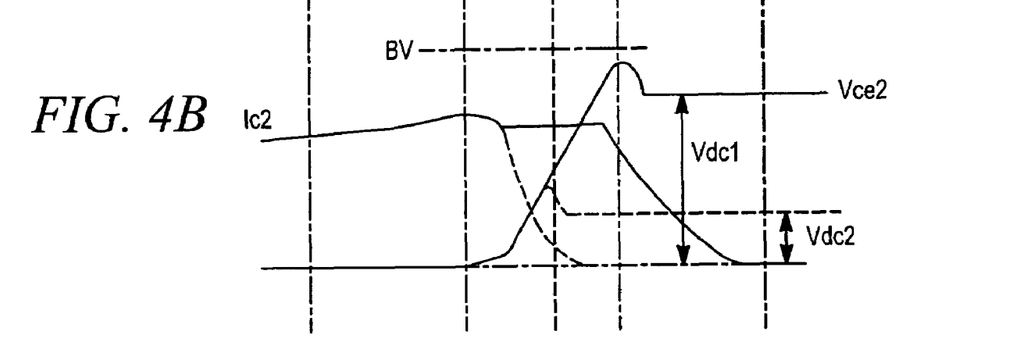

FIG. 4A illustrates waveforms at turn-off of the IGBT in the application example described in connection with FIG. 1, and FIG. 4B illustrates waveforms at turn-off of an IGBT in a conventional circuit described in Japanese Kokai Patent Application No. 2004-187463. With reference to FIG. 4A, the effect of the driver 12 for a voltage driven type switching element 11 having the capacitor C1 connected in parallel with the resistor R1 will be explained as an example of the delay circuit for delaying the start of operation of the discharge rate controller circuit for controlling the change rate over time dV/dt of collector voltage Vce to a prescribed lower change rate.

More specifically, FIG. 4A illustrates the waveforms of the collector current Ic1 and collector voltage Vce1 during the turn-off operation of the IGBT Q1 shown in FIG. 1. The solid line corresponds to the case where power voltage Vcc has a higher voltage value Vdc1, and the broken line corresponds to the case where the power voltage Vcc has a lower voltage value Vdc2 (Vdc1>Vdc2).

On the other hand, FIG. 4B illustrates the same waveforms experienced during turn-off of the IGBT as described in Japanese Kokai Patent Application No. 2004-187463. Similarly, the solid line and the broken line show collector current Ic2 and collector-emitter voltage Vce2 when power voltage Vcc is higher voltage value Vdc1 and lower voltage value Vdc2 (Vdc1>Vdc2), respectively.

As can be seen from the switching waveforms in FIGS. 4A and 4B, when the power voltage Vcc is equal to the high voltage value Vdc1, the peak voltages of both collector-emitter voltages Vce1 and Vce2 are turned off below the voltage rating (BV) of the voltage driven type switching element, and it is possible to prevent the collector-emitter voltage of the IGBT Q1 from exceeding the voltage rating.

However, in the waveforms corresponding to the gate driver 12 described herein and as shown in FIG. 4A, it is possible to reduce the switching loss when the power voltage Vcc is equal to the lower voltage value Vdc2 by initially changing the collector voltage Vce of the IGBT Q1 at a high rate of change over time dV/dt. This is not possible with the conventional circuit constitution shown in FIG. 4B because even when the power voltage Vcc is equal to the lower voltage value Vdc2, a constant, lower rate of change over time dV/dt is employed to accommodate the case in which the higher power voltage value Vdc1 is applied to the collector terminal of the IGBT. In contrast, as explained in connection with the circuit shown in FIG. 1, the delay circuit allows a higher rate of change over time dV/dt of the collector voltage Vce for a prescribed delay time before transitioning to a lower change rate, and it is thus possible to control of change rate over time dV/dt in two steps.

As a result of the delay circuit, when the power voltage Vcc is equal to the lower voltage value Vdc2 as indicated by the broken line in FIG. 4A, the turn-off operation can be performed at a higher switching rate.

Thus, when the power voltage is of a lower voltage value Vdc2, even when change rate over time dV/dt of collector voltage Vce increases (that is, even when the switching rate is higher), the sum of the power voltage and the surge voltage applied to the collector terminal of the voltage driven type switching element 11 does not exceed the voltage rating BV. Consequently, as shown in FIG. 4A it is possible to perform switching at a higher rate during turn-off of the IGBT Q1, and the switching loss during turn-off is thereby reduced.

The above may be further explained. With the gate driver 12 of voltage driven type switching element 11, by delaying control of change rate over time dV/dt of the collector voltage by a prescribed delay time after the start of the turn-off operation, it is possible to utilize a rate of change that corresponds to the magnitude of collector voltage Vce of the voltage driven type switching element, instead of utilizing a predetermined rate of change that corresponds to the largest expected collector voltage Vce.

Accordingly, the circuit 12 is such that the gate charge of the voltage driven type switching element 11 is discharged at a high rate during the period of time immediately following the start of the turn-off operation. Subsequently, after passage of a prescribed delay time, the gate discharge rate is changed to a prescribed lower discharge rate. As a result, to the extent that the power voltage is low, such that the sum of the power voltage and the surge voltage would not result in a collector voltage Vce in excess of the voltage rating of the voltage driven type switching element 11 as a result of discharging the gate terminal at an initially higher rate, the switching rate at turn-off can be increased, thereby reducing the switching loss.

Also, even when collector voltage Vce is higher the prescribed delay time after start of the turn-off operation can be calibrated to end immediately before generation of the surge voltage at turn-off of voltage driven type switching element 11. At that time, it is possible to change the gate discharge rate to a prescribed lower rate, and thereby it is possible to prevent collector voltage Vce of the voltage driven type switching element from exceeding the voltage rating. At the same time, the switching loss is lowered.

Also, the above described embodiments have been described in order to allow easy understanding of the present invention, and do not limit the present invention. On the contrary, the invention is intended to cover various modifications and equivalent arrangements included within the scope of the appended claims, which scope is to be accorded the broadest interpretation so as to encompass all such modifications and equivalent structures as is permitted under the law.

What is claimed is:

1. An apparatus for driving a voltage driven type switching element including a collector terminal, an emitter terminal and a gate terminal connected to a power source supplied at a voltage level, the apparatus comprising:

a discharge circuit connected to the voltage driven type switching element and operable to discharge an electrical charge stored at the gate terminal at a discharge rate during a turn-off operation of the voltage driven type switching element in which the voltage driven type switching element makes a transition from on to off;

a discharge rate controller circuit operable to control the discharge rate so that a change rate over time of a voltage between the collector terminal and the emitter terminal is limited to a second change rate during the turn-off operation; and a delay circuit operable to delay a starting time of the operation of the discharge rate controller circuit to limit the discharge rate to the second change rate for a prescribed delay time after a start of the turn-off operation and before a time when the voltage between the collector terminal and the emitter terminal first reaches the voltage level of the power source, thereby providing a time period during which the discharge rate is initially at a first change rate higher than the second change rate.

2. The apparatus according to claim 1 wherein the prescribed delay time extends from the start of the turn-off operation to a time when the voltage between the collector terminal and the emitter terminal reaches a prescribed voltage less than the voltage level of the power source.

3. The apparatus according to claim 1 wherein the first change rate is a constant, non-zero rate and the second change rate is a constant, non-zero rate.

4. The apparatus according to claim 1 wherein the discharge circuit includes a pnp transistor and a gate resistor, a pnp emitter terminal of the pnp transistor connected via the gate resistor to the gate terminal and a pnp collector terminal of the pnp transistor connected to a reference potential.

5. The apparatus according to claim 4 wherein the discharge rate controller circuit includes a base resistor and a first capacitor, the base resistor connected between the reference potential and a pnp base terminal of the pnp transistor and the first capacitor connected between the pnp base terminal and the collector terminal.

6. The apparatus according to claim 5 wherein the prescribed delay time extends from the start of the turn-off operation to a time when a base voltage of the pnp transistor approaches a threshold voltage for operation of the pnp transistor.

7. The apparatus according to claim 5 wherein the discharge rate controller circuit includes a diode connected in series with the first capacitor, an anode of the diode connected to the first capacitor and a cathode of the diode connected to the pnp base terminal; and wherein the discharge rate controller circuit includes a pull-down resistor connected between the reference potential and a connecting point of the diode and the first capacitor.

8. The apparatus according to claim 5 wherein the delay circuit includes a second capacitor connected between the reference potential and the pnp base terminal, the prescribed delay time being a function of a capacitance value of the second capacitor.

9. The apparatus according to claim 8 wherein the capacitance value of the second capacitor is greater than a capacitance value of the first capacitor.

10. The apparatus according to claim 8 wherein the second capacitor is connected in parallel with the base resistor.

11. The apparatus according to claim 10 wherein the capacitance value of the second capacitor is greater than a capacitance value of the first capacitor.

12. An apparatus for driving a voltage driven type switching element including a gate terminal, a collector terminal and an emitter terminal connected to a power source supplied at a voltage level, the apparatus comprising:

means for initiating a transition of the voltage driven type switching element from an on-state to an off-state;

means for controlling a discharge rate of an electrical energy stored at the gate terminal during the transition so that a change rate over time of a voltage between the collector terminal and the emitter terminal is limited to a second change rate during the turn-off operation; and means for delaying a starting time of the controlling the discharge rate to the second change rate for a prescribed delay time after initiating the transition and before a time when the voltage between the collector terminal and the emitter terminal first reaches the voltage level of the power source, thereby providing a time period during which the discharge rate is initially at a first change rate higher than the second change rate.

13. The apparatus according to claim 12 wherein the prescribed delay time is a period from a start of the transition to a time when the voltage between the collector terminal and the emitter terminal reaches a prescribed voltage less than the voltage level of the power source.

14. The apparatus according to claim 12 wherein the initiating means comprises a push-pull circuit.

15. An apparatus for driving a voltage driven type switching element including a gate terminal, a collector terminal and an emitter terminal, the apparatus comprising:

means for initiating a transition of the voltage driven type switching element from an on-state to an off-state;

means for controlling a discharge rate of an electrical energy stored at the gate terminal during the transition so that a change rate over time of a voltage between the collector terminal and the emitter terminal approaches a predetermined change rate; wherein the controlling means comprises a pnp transistor having a pnp base terminal, a pnp emitter terminal connected via a gate resistor to the gate terminal and a pnp collector terminal connected to a reference potential, a base resistor connected between the pnp base terminal and the reference potential, and a first capacitor connected between the pnp base terminal and the collector terminal; and means for delaying controlling the discharge rate for a prescribed delay time after initiating the transition.

16. The apparatus according to claim 15 wherein the prescribed delay time is a period from a start of the transition to a time when the pnp base voltage becomes a threshold voltage level for start of operation of the pnp transistor.

17. The apparatus according to claim 15 wherein the delaying controlling means comprises a second capacitor connected in parallel with the base resistor, a capacitance value of the second capacitor being larger than a capacitance value of the first capacitor.

18. The apparatus according to claim 17 wherein the controlling means further comprises a diode connected in series with the first capacitor such that an anode of the diode is connected to the first capacitor and a cathode of the diode is connected to the pnp base terminal and a pull-down resistor connected between the reference potential and a connecting point between the diode and the first capacitor.

19. A method for driving a voltage driven type switching element including a gate terminal, a collector terminal and an emitter terminal connected to a power source supplied at a voltage level, the method comprising:

initiating a transition of the voltage driven type switching element from an on-state to an off-state;

discharging an electrical charge stored at the gate terminal at a discharge rate during the transition;

controlling the discharge rate so that a change rate over time of a voltage between the collector terminal and the emitter terminal is limited to a second change rate during the transition; and delaying a starting time of controlling the discharge rate to the second change rate for a prescribed delay time after initiating the transition and before reaching a time when the voltage between the collector terminal and the emitter terminal first reaches the voltage level of the power source, thereby providing a time period during which the discharge rate is initially at a first change rate higher than the second change rate.

20. The method according to claim 19 wherein delaying controlling the discharge rate comprises:
   beginning the delaying at a start of the transition; and
   ending the delaying when the voltage between the collector terminal and the emitter terminal reaches a prescribed voltage less than the voltage level of the power source.

21. The method according to claim 19 wherein a pnp emitter terminal of a pnp transistor is connected to the gate terminal and a pnp collector terminal of the pnp transistor is connected to a reference potential; and wherein delaying controlling the discharge rate comprises:
   beginning the delaying at a start of the transition; and
   ending the delaying when a base voltage of the pnp transistor approaches a threshold voltage for operation of the pnp transistor.

* * * * *